United States Patent
Huang

(10) Patent No.: US 8,502,418 B2
(45) Date of Patent: Aug. 6, 2013

(54) AUTO-SHUT OFF CIRCUIT

(75) Inventor: Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 453 days.

(21) Appl. No.: 12/981,483

(22) Filed: Dec. 30, 2010

(65) Prior Publication Data

US 2012/0139364 A1   Jun. 7, 2012

(30) Foreign Application Priority Data

Dec. 7, 2010   (CN) .......................... 2010 1 0577175

(51) Int. Cl.
   *H02J 1/00*   (2006.01)

(52) U.S. Cl.
   USPC .......................................................... 307/85

(58) Field of Classification Search
   USPC .......................................................... 307/85
   See application file for complete search history.

(56) References Cited

U.S. PATENT DOCUMENTS 3,474,296 A * 10/1969 Rickey .......................... 361/92
2010/0149716 A1* 6/2010 Bakken et al. ............... 361/143

* cited by examiner

*Primary Examiner* — Robert L. Deberadinis
(74) *Attorney, Agent, or Firm* — Altis Law Group, Inc.

(57) ABSTRACT

An auto-shut off circuit includes a relay, a voltage conversion device, a first diode, a second diode, a third diode, a capacitor, a first transistor, and a second transistor. The relay includes a coil and a switch. The auto-shut off circuit disconnects an electronic device from a power supply when the electronic device is not at a working state.

4 Claims, 1 Drawing Sheet

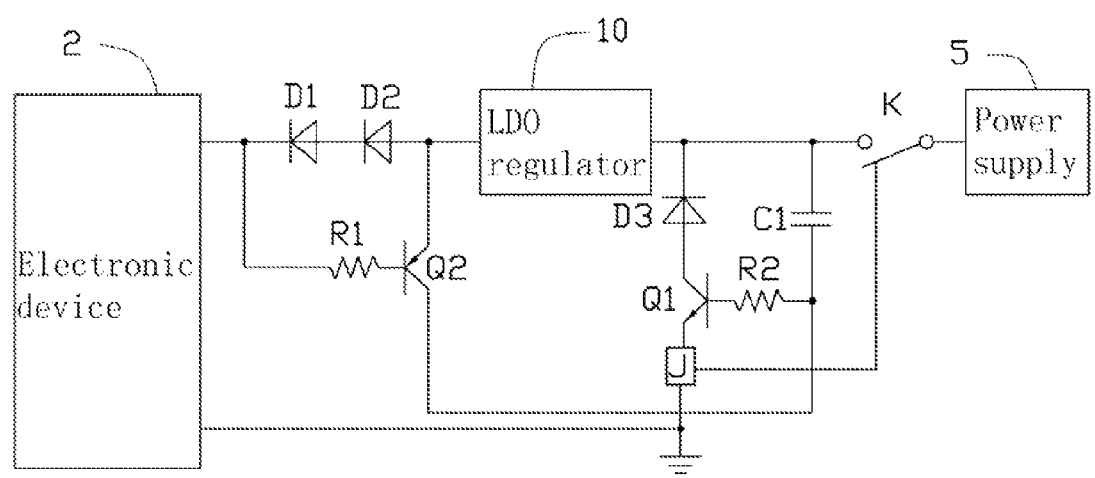

AUTO-SHUT OFF CIRCUIT

BACKGROUND

1. Technical Field

The present disclosure relates to an auto-shut off circuit.

2. Description of Related Art

When an electronic device is not in a working state, a power plug of the electronic device is still always connected to a socket. Even though it is powered off, it is still consuming power and could be a safety hazard.

BRIEF DESCRIPTION OF THE DRAWING

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

The FIGURE is a circuit diagram of an exemplary embodiment of an auto-shut off circuit.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to the FIGURE, an exemplary embodiment of an auto-shut off circuit includes a relay, a low dropout (LDO) regulator 10, three diodes D1, D2, and D3, a capacitor C1, two transistors Q1 and Q2, and two resistors R1 and R2. The relay includes a coil J and a switch K.

A first terminal of the switch K is connected to a power supply 5. A second terminal of the switch K is connected to an input terminal of the low dropout regulator 10 and a first terminal of the capacitor C1. A second terminal of the capacitor C1 is connected to a base of the transistor Q1 through the resistor R2. The second terminal of the capacitor C1 is further connected to a collector of the transistor Q2. A collector of the transistor Q1 is connected to an anode of the diode D3. A cathode of the diode D3 is connected to the input terminal of the low dropout regulator 10. An emitter of the transistor Q1 is connected to a first terminal of the coil J. A second terminal of the coil J is grounded.

An emitter of the transistor Q2 is connected to an output terminal of the low dropout regulator 10. A base of the transistor Q2 is connected to an electronic device 2 through the resistor R1. The output terminal of the low drop regulator 10 is connected to an anode of the diode D2. A cathode of the diode D2 is connected to an anode of the diode D1. A cathode of the diode D1 is connected to the electronic device 2.

When the electronic device 2 is in a working state, the low dropout regulator 10 supplies power to the electronic device 2. At this time, there is 1.3V-1.4V between the anode of the diode D2 and the cathode of the diode D1, thus to turn on the transistor Q2. The transistor Q1 is also turned on. As a result, the coil J is electrified, to turn on the switch K. Meanwhile, the capacitor C1 is charged.

When the electronic device 2 is not in a working state, the diodes D1 and D2 are turned off. As a result, the transistor Q2 is turned off. Meanwhile, the capacitor C1 is discharged. When the capacitor C1 is fully discharged, the coil J is also in a discharged state thus the switch K turns off.

In addition, in the embodiment, the low dropout regulator 10 is used for converting the voltage of the power supply 10 to another voltage to supply for the electronic device 2. In other embodiments, another voltage conversion device may replace the low dropout regulator 10.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An auto-shut off circuit comprising:
    a relay comprising a coil and a switch;
    a voltage conversion device comprising an input terminal and an output terminal;
    first to third diodes;
    a capacitor; and
    a first transistor and a second transistor;
    wherein a first terminal of the switch is connected to a power supply, a second terminal of the switch is connected to the input terminal of the voltage conversion device, a first terminal of the capacitor is connected to the second terminal of the switch, a second terminal of the capacitor is connected to a base of the first transistor and a collector of the second transistor, a collector of the first transistor is connected to an anode of the first diode, a cathode of the first diode is connected to the input terminal of the voltage conversion device, an emitter of the first transistor is connected to a first terminal of the coil, a second terminal of the coil is grounded, an emitter of the second transistor is connected to the output terminal of the voltage conversion device, a base of the second transistor is connected to an electronic device, the output terminal of the voltage conversion device is connected to an anode of the second diode, a cathode of the second diode is connected to an anode of the third diode, a cathode of the third diode is connected to the electronic device.

2. The auto-shut off circuit of claim 1, wherein the voltage conversion device is a low dropout regulator.

3. The auto-shut off circuit of claim 1, further comprising a resistor, wherein the base of the second transistor is connected to the cathode of the third diode through the resistor.

4. The auto-shut off circuit of claim 1, further comprising a resistor, wherein a base of the first transistor is connected to the second terminal of the capacitor through the resistor.

* * * * *